United States Patent
Endo et al.

(10) Patent No.: US 7,808,003 B2
(45) Date of Patent: Oct. 5, 2010

(54) SILICON CARBIDE SEMICONDUCTOR DEVICE

(75) Inventors: Takeshi Endo, Toyota (JP); Eiichi Okuno, Mizuho (JP)

(73) Assignee: DENSO CORPORATION, Kariya (JP)

( * ) Notice: Subject to any disclaimer, the term of this patent is extended or adjusted under 35 U.S.C. 154(b) by 187 days.

(21) Appl. No.: 12/285,351

(22) Filed: Oct. 2, 2008

(65) Prior Publication Data

US 2009/0090920 A1    Apr. 9, 2009

(30) Foreign Application Priority Data

Oct. 5, 2007    (JP)    ................ 2007-262031

(51) Int. Cl.
   *H01L 29/15*    (2006.01)
   *H01L 31/0312*    (2006.01)

(52) U.S. Cl. .......... 257/77; 257/E21.603; 257/E21.605; 257/E29.297; 257/E29.298

(58) Field of Classification Search ................ 257/77, 257/E21.603, E21.605, E29.297, E29.298
   See application file for complete search history.

(56) References Cited

U.S. PATENT DOCUMENTS

| | | | | |
|---|---|---|---|---|
| 5,719,409 | A * | 2/1998 | Singh et al. | 257/77 |
| 5,864,159 | A | 1/1999 | Takahashi | 257/330 |
| 5,895,939 | A * | 4/1999 | Ueno | 257/279 |
| 5,976,936 | A | 11/1999 | Miyajima et al. | 438/268 |
| 6,020,600 | A | 2/2000 | Miyajima et al. | 257/76 |
| 6,057,558 | A | 5/2000 | Yamamoto et al. | 257/77 |
| 6,573,534 | B1 | 6/2003 | Kumar et al. | 257/77 |
| 6,576,929 | B2 * | 6/2003 | Kumar et al. | 257/77 |
| 6,600,192 | B1 * | 7/2003 | Sugawara et al. | 257/329 |
| 6,936,850 | B2 * | 8/2005 | Friedrichs et al. | 257/77 |
| 6,949,401 | B2 * | 9/2005 | Kaminski et al. | 438/92 |
| 7,282,739 | B2 * | 10/2007 | Kaneko | 257/77 |
| 7,414,268 | B2 * | 8/2008 | Ryu et al. | 257/77 |
| 2002/0079535 | A1 | 6/2002 | Tihanyi et al. | 257/329 |
| 2006/0255423 | A1 * | 11/2006 | Ryu et al. | 257/485 |
| 2007/0170436 | A1 * | 7/2007 | Sugawara | 257/77 |
| 2007/0252172 | A1 * | 11/2007 | Hayashi et al. | 257/192 |
| 2008/0087951 | A1 | 4/2008 | Takaya et al. | 257/334 |

(Continued)

FOREIGN PATENT DOCUMENTS

JP    A-01-192175    8/1989

(Continued)

OTHER PUBLICATIONS

Office Action mailed Dec. 15, 2009 from the Japan Patent Office for corresponding patent application No. 2007-262031 (English translation enclosed).

(Continued)

*Primary Examiner*—Ida M Soward
(74) *Attorney, Agent, or Firm*—Posz Law Group, PLC

(57) ABSTRACT

A silicon carbide semiconductor device is disclosed. The silicon carbide semiconductor device includes a substrate; a drift layer having a first conductivity type and located on a first surface of the substrate; and a vertical type semiconductor element. The vertical type semiconductor element includes: an impurity layer having a second conductivity type, and located in a surface portion of the drift layer; and a first conductivity type region located in the drift layer, spaced away from the impurity layer, located closer to the substrate than the impurity layer, and having an impurity concentration higher than the drift layer.

18 Claims, 12 Drawing Sheets

U.S. PATENT DOCUMENTS

2008/0191304 A1* 8/2008 Zhang et al. .............. 257/471
2009/0134402 A1* 5/2009 Yatsuo et al. .............. 257/77

FOREIGN PATENT DOCUMENTS

| JP | A-5-55594 | 3/1993 |
| --- | --- | --- |
| JP | A-05-75099 | 3/1993 |
| JP | A-07-176731 | 7/1995 |
| JP | A-2000-252478 | 9/2000 |
| JP | A-2001-094098 | 4/2001 |
| JP | A-2003-229570 | 8/2003 |
| JP | A-2004-228287 | 8/2004 |
| JP | A-2006-93193 | 4/2006 |
| JP | A-2006-196652 | 7/2006 |
| JP | A-2007-220878 | 8/2007 |

OTHER PUBLICATIONS

Notification of Reason for Refusal issued from the Japanese Patent Office on Jun. 1, 2010 in the corresponding Japanese patent application No. 2007-262031 (a copy and English translation thereof).

* cited by examiner

US 7,808,003 B2

SILICON CARBIDE SEMICONDUCTOR DEVICE

CROSS REFERENCE TO RELATED APPLICATION

The present application is based on Japanese Patent Application No. 2007-262031 filed on Oct. 5, 2007, the disclosure of which is incorporated herein by reference.

BACKGROUND OF THE INVENTION

1. Field of the Invention

The present invention relates to a silicon carbide semiconductor device.

2. Description of Related Art

A silicon carbide semiconductor device is a device that is formed by using silicon carbide (SiC) as semiconductor material. JP-A-H10-308510, corresponding to U.S. Pat. No. 6,573,534, discloses an SiC semiconductor device including a planer metal-oxide-semiconductor field-effect transistor (MOSFET). JP-A-H5-55594 discloses a configuration for improving a surge resistance of a silicon semiconductor device. According to the configuration, a p type well region that functions as a deep base region is located below a p type base region.

The inventors have revealed the following idea, as a related art. A surge resistance of the planer MOSFET disclosed in JP-A-H10-308510 can be improved when a p type well region is formed below a p type base region in a manner similar to that disclosed in JP-A-H5-55594.

Discussion is given below on the above idea, as a related art. In manufacturing an SiC semiconductor device, since impurities are difficult to diffuse in SiC, it is difficult to employ a diffusion process that is widely used in manufacturing a silicon device. It is hence difficult to form a p type well layer to a deep position in SiC by the diffusion process. Thus, a breakdown can easily take place not in a cell portion but a periphery of the cell portion. Since an area of the periphery of the cell portion is relatively small, a surge energy is difficult to be absorbed. Additionally, even when a breakdown takes place in the cell portion, a breakdown occurs at a corner part of a p type base region. In such a case, an electric potential below an n+ type source region easily increases. A parasitic transistor provided by the n+ type source region, a p type base region and an n type drift region becomes an on state, causing element destruction. Alternatively, the p type base region may be biased, and a substrate bias effect may non-uniformly form a channel and cause element destruction.

The above difficulties associated with the surge resistance are relevant to not only a planer MOSFET but also a vertical type semiconductor device, in which a current flows between a front surface and a rear surface of the substrate. Such a vertical type semiconductor device is, for example, a trench gate MOSFET, an insulated gate bipolar transistor (IGBT), a Schottky barrier diode (SBD), or a junction barrier diode (JBS).

SUMMARY OF THE INVENTION

In view of the above and other difficulties, it is an objective of the present invention to provide a silicon carbide semiconductor device having a vertical type semiconductor element capable of improving a surge resistance.

According to a first aspect of the present invention, a silicon carbide semiconductor device having a vertical type semiconductor element is provided. The silicon carbide semiconductor device includes: a substrate made of silicon carbide; and a drift layer made of silicon carbide, having a first conductivity type, and located on a first surface of the substrate. The substrate and the drift layer provide a cell portion. The silicon carbide semiconductor device further includes: an impurity layer having a second conductivity type, located in the cell portion, and located in a surface portion of the drift layer; a first electrode located on a first surface side of the substrate so that the drift layer and the impurity layer are located between the first electrode and the substrate; a second electrode located on a second surface side of the substrate; and a first conductivity type region located in the cell portion, located in the drift layer, spaced away from the impurity layer, located closer to the substrate than the impurity layer, and having an impurity concentration larger than the drift layer. The vertical semiconductor element is located in the cell portion. The vertical type semiconductor device element is configured so that a current flows between the first electrode and the second electrode.

According to the above silicon carbide semiconductor device, due to a presence of the above first conductivity type region, a breakdown occurs at a corner part of the first conductivity type region on an upper side. The first conductivity type region causes a body breakdown to occur. Accordingly, it is possible to improve a surge resistance.

According to a second aspect of the present invention, a silicon carbide semiconductor device having an accumulation type MOS structure semiconductor element is provided. The silicon carbide semiconductor device includes: a substrate made of silicon carbide, and having one of a first conductivity type and a second conductivity type; and a drift layer made of silicon carbide, having the first conductivity type, and located above the substrate. The substrate and the drift layer provide a cell portion. The silicon carbide semiconductor device further includes: a base region made of silicon carbide, having the second conductivity type, located in the cell portion, and located in a surface portion of the drift layer; a channel region made of silicon carbide, having the first conductivity type, and located on a surface of the base region and a surface of the drift layer; a source region made of silicon carbide, having the first conductivity type, extending from the channel region into the base region, and having an impurity concentration larger than the drift layer; a gate insulation film located on a surface of the channel region; a gate electrode located above the gate insulation film; a source electrode electrically connected with the source region; a drain electrode located on a rear surface side of the substrate; and a first conductivity type region located in the cell portion, located in drift layer, spaced away from the base region, located closer to the substrate than the base region, and having an impurity concentration larger than the drift layer. The accumulation type semiconductor element is configured so that a current flow between the source electrode and the drain electrode through the source region and the drift layer under control of channel formation in the channel region, the channel formation being controlled by controlling a voltage applied to the gate electrode.

According to the above silicon carbide semiconductor device, due to a presence of the above first conductivity type region, a breakdown occurs at a corner part of the first conductivity type region on an upper side. The first conductivity type region causes a body breakdown to occur. Accordingly, it is possible to improve a surge resistance.

According to a third aspect of the present invention, a silicon carbide semiconductor device having an inversion type MOS structure semiconductor element is provided. The silicon carbide semiconductor device includes: a substrate made of silicon carbide, and having one of a first conductivity type and a second conductivity type; and a drift layer made of silicon carbide, having the first conductivity type, and located above the substrate. The substrate and the drift layer provide a cell portion. The silicon carbide semiconductor device further includes: a base region made of silicon carbide, having the second conductivity type, located in the cell portion, and located in a surface portion of the drift layer; a source region made of silicon carbide, having the first conductivity type, located in the base region, and having an impurity concentration larger than the drift layer; a gate insulation film located on a surface of the base region; a gate electrode located above the gate insulation film; a source electrode electrically connected with the source region; a drain electrode located on a rear surface side of the substrate; and a first conductivity type region located in the cell portion, located in drift layer, spaced away from the base region, located closer to the substrate than the base region, having an impurity concentration larger than the drift layer. The inversion type semiconductor element is configured so that a current flow between the source electrode and the drain electrode through the source region and the drift layer under control of a channel formed in a portion of the base region. The portion of the base region contacts the gate electrode. The channel is controlled by a voltage applied to the gate electrode.

According to the above silicon carbide semiconductor device, due to a presence of the above first conductivity type region, a breakdown occurs at a corner part of the first conductivity type region on an upper side. The first conductivity type region causes a body breakdown to occur. Accordingly, it is possible to improve a surge resistance.

According to a fourth aspect of the present invention, a silicon carbide semiconductor device is provided. The silicon carbide semiconductor device includes: a substrate made of silicon carbide, having a first conductivity type, and having a principal surface and a rear surface; and a drift layer made of silicon carbide, having the first conductivity type, located above the principal surface of the substrate, and having an impurity concentration smaller than the substrate. The substrate and the drift layer provide a cell portion. The silicon carbide semiconductor device further includes a Schottky barrier diode located in the cell portiori. The Schottky barrier diode includes: a Schottky electrode having a Schottky contact with the drift layer; an ohmic electrode located on the rear surface of the substrate; and a first conductivity type region located in the drift layer, spaced away from the Schottky electrode, and having an impurity concentration larger than the drift layer.

According to the above silicon carbide semiconductor device, due to a presence of the above first conductivity type region, a breakdown occurs at a corner part of the first conductivity type region on an upper side. The first conductivity type region causes a body breakdown to occur. Accordingly, it is possible to improve a surge resistance. Since the first conductivity type region is certainly located lower than the second conductivity type region, an avalanche breakdown can take place in the cell portion. Accordingly, it is possible to improve a surge resistance.

According to a fifth aspect of the present invention, a silicon carbide semiconductor device is provided. The silicon carbide semiconductor device includes: a substrate made of silicon carbide, having a first conductivity type, and having a principal surface and a rear surface; and a drift layer made of silicon carbide, having the first conductivity type, located on the principal surface of the substrate, and having an impurity concentration smaller than the substrate. The substrate and the drift layer provide a cell portion. The silicon carbide semiconductor device further includes: an insulation film located above the drift layer and having an opening located in the cell portion; a second conductivity type layer located in the cell portion, and located in a surface portion of the drift layer; and a P-N diode located in the cell portion. The P-N diode further includes: a first ohmic electrode contacting the second conductivity type layer with an ohmic contact through the opening of the insulation film; a second ohmic electrode located on a rear surface of the substrate; and a first conductivity type region located in the cell portion, located in the drift layer, located deeper than the second conductivity type layer, having an impurity concentration larger than the drift layer.

According to the above silicon carbide semiconductor device, due to a presence of the above first conductivity type region, a breakdown occurs at a corner part of the first conductivity type region on an upper side. The first conductivity type region causes a body breakdown to occur. Accordingly, it is possible to improve a surge resistance.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EXEMPLARY EMBODIMENTS

Exemplary embodiments are described below with reference to the accompanying drawings. In the following embodiments, like parts or equivalent parts refer to like numeral references.

First Embodiment

Figure 1:
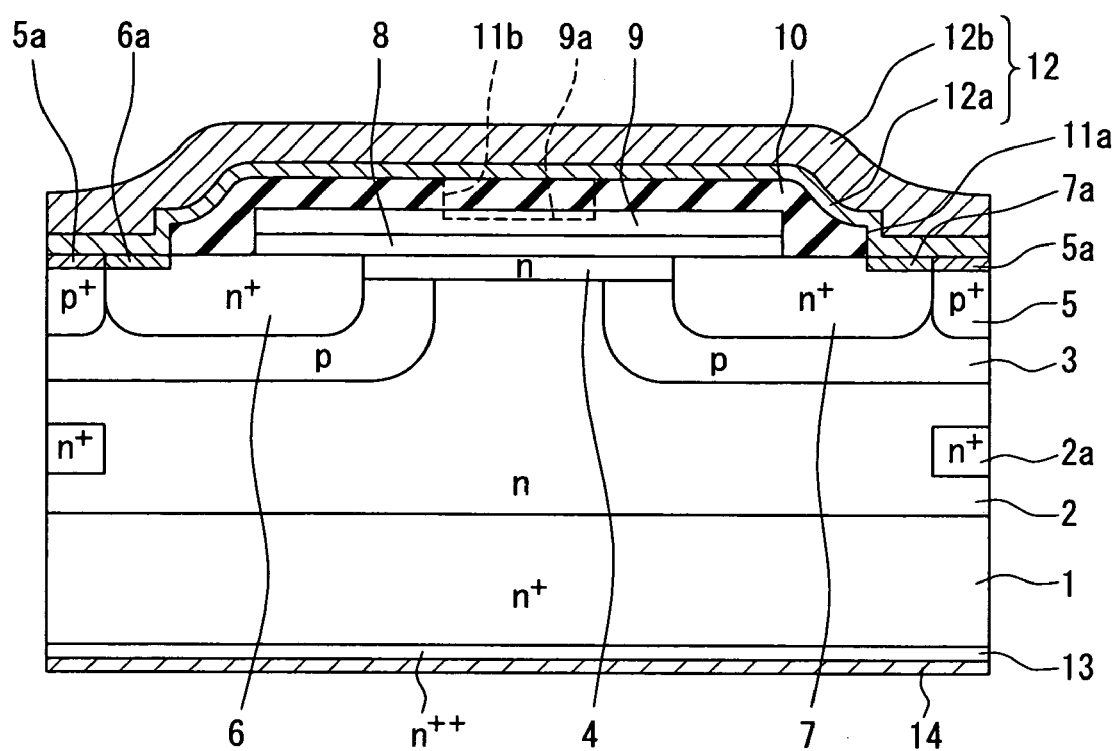
FIG. 1 is a cross sectional diagram illustrating an SiC semiconductor device having a planer MOSFET in accordance with a first embodiment.

A first embodiment is explained below. In the present embodiment, an SiC semiconductor device including a planer MOSFET is presented. A configuration of the planer MOSFET and a method of manufacturing the planer MOSFET are described below with reference to FIG. 1, FIGS. 2A to 2D, and FIGS. 3A to 3D. FIG. 1 is a cross sectional diagram illustrating the SiC semiconductor device having the planer MOSFET in accordance with the present embodiment. FIGS. 2A to 2D and FIG. 3A to 3D are cross sectional diagrams illustrating manufacturing processes of the planer MOSFET shown in FIG. 1.

As shown in FIG. 1, the planer MOSFET is formed by using a substrate 1. The substrate 1 is made of SiC, having an n+ conductivity type, and having a principal surface on one surface side. For example, the substrate 1 is made of 4H-SiC and have an impurity concentration of about $5 \times 10^{18}$ cm$^{-3}$. The substrate 1 has the principal surface on a-face, for example, on the (11-20) face.

An n type drift layer 2 is located on the principal surface of the substrate 1. The n type drift layer 2 is made of SiC and formed by epitaxial growth. For example, the n type drift layer 2 has an impurity concentration of about $1 \times 10^{16}$ cm$^{-3}$, and a thickness of about 10 μm.

Multiple p type base regions 3 are located in a surface portion of the n type drift layer 2. The multiple p type base regions 3 are spaced away from each other at given intervals. For example, each p type base region 3 has an impurity concentration of about $1 \times 10^{19}$ cm$^{-3}$, and a depth of about 0.7 μm.

An n type channel region 4 for providing a channel region is located on the p type base regions 3. The n type channel region 4 is formed by epitaxial growth. The n type channel region 4 is also referred to herein as a channel epitaxial layer 4. For example, the channel epitaxial layer 4 has an impurity concentration of about $1 \times 10^{16}$ cm$^{-3}$, and a layer thickness (i.e., a depth) of about 0.3 μm.

Contact regions 5 penetrate the channel epitaxial layer 4 and reach the p type base region 3. Each contact region 5 has a p+ conductivity type. For example, each contact region 5 has a high impurity concentration greater than or equal to $3 \times 10^{20}$ cm$^{-3}$, and a depth of about 0.4 μm.

N+ type source regions 6, 7 are located inward of the contact regions 5 and located on opposite sides of the channel epitaxial layer 4. The channel epitaxial layer 4 is located between the n+ type source regions 6, 7. The n+ type source regions 6, 7 are spaced away from each other. For example, each n+ type source region 6, 7 has a high impurity concentration greater than or equal to $3 \times 10^{20}$ cm$^{-3}$ and has a depth of about 0.3 μm.

Parts of a surface portion of the channel epitaxial layer 4, which are located above the p type base regions 3, provide channel regions. A gate oxide film 8 is formed so as to cover at least a surface of the channel region. The gate oxide film 8 has a film thickness of, for example, about 52 nm.

A gate electrode 9 is located on a surface of the gate oxide film 8, and is patterned. The gate electrode 9 is made of polysilicon doped with n type impurities (e.g., P or N). A edge portion of the gate electrode 9 is rounded in shape.

An interlayer insulation film 10 is formed and located so as to cover a rest part of the gate electrode 9 and the gate oxide film 8. The interlayer insulation film 10 is made of, for example, boro-phospho silicate glass (BPSG). Contact holes 11a, 11b are formed in the interlayer insulation film 10 and the gate oxide film 8. The contact hole 11a is communicated with the contact region 5 and the n+ type source regions 6, 7. The contact hole 11b is communicated with the gate electrode. The contact hole 11b appears in a cross section different from that shown in FIG. 1. A contact member 9a is located through the contact hole 11b. Contact members 5a, 6a, 7a are located through the contact hole 11a. The contact member 9a is electrically connected with the gate electrode 9. The contact members 5a, 6a, 7a are electrically connected with the contact region 5, the n+ type source regions 6, 7, respectively. Each contact member 5a, 6a, 7a, 9a is made of Ni or Ti/Ni. A source electrode 12 and a gate line are also located through the contact holes 11a, 11b. The source electrode 12 includes a base wiring electrode 12a made of Ti and a wiring electrode 12b made of Al.

A drain contact region 13 is formed and located on a rear surface of the substrate 1. The drain contact region 13 has a p+ conductivity type and an impurity concentration higher than that of the substrate 1. A drain electrode 14, which is a rear surface electrode, is formed and located on the drain contact region 13. The drain electrode 14 is made of, for example, Ni.

In the present embodiment, n+ type regions 2a are located in the n type drift layer 2 and located below the contact regions 5. More specifically, the n+ type region 2a is located below a portion that is located opposite to the channel epitaxial layer 4 with respect to the n+ type source region 6 or 7, and further, the n+ type region 2a is located below a portion of the p type base region 3 that is electrically connected with the source electrode 12. The n+ type region 2a has a high impurity concentration of, for example, $1 \times 10^{17}$ cm$^{-3}$ or more.

Although a depth position where the n+ type region 2a is located can be properly changed, it is preferable that the n+ type region 2a is formed at a depth position such that a breakdown voltage of the cell portion is lower than that of a periphrical part. In the present embodiment, the n+ type region 2a is located a 6 μm to 6.3 μm depth from a surface of the n type drift layer 2. A width of the n+ type region 2a, which corresponds to a length of the n+ type region 2a in a direction parallel to the principal surface of the substrate 1 on the cross section illustrated in FIG. 1, can be also properly changed. However, when the n+ type region 2a has too much width, carriers generated due to an avalanche breakdown flow below the source region. As a result, a parasitic transistor may operate and a surge resistance decreases. The planer MOSFET is provided with the above-described configuration.

When the planer MOSFET normally operates, the channel epitaxial layer 4 (i.e., the channel region) provides a current path. A current flows between the n+ type source regions 6,7 and the drain contact region 13, which are located upstream and downstream of the current path. By controlling a voltage applied to the gate electrode 9, a width of a depletion layer created in the channel region is controlled, and a current flowing through the channel region is controlled. It is thereby possible to control a current flowing between the n+ type source regions 6, 7 and the drain contact region 13.

In a case of surge, because of a presence of the n+ type region 2a, a breakdown takes places at a corner part 2b f the n+ type region 2a, wherein the corner part 2b is located on an upper side of the n+ type region 2a. A body breakdown between the p type base region 3 and the n+ type region 2a can occur. Since it is possible to prevent carriers generated due to the breakdown from flowing below the n+ type source regions 6, 7, the parasitic transistor provided by the n+ type source regions 6, 7, the p type base region 3 and the n type drift layer 2 does not operate in the surge. It is hence possible to improve the surge resistance. Therefore, the planer MOSFET is provided with an improved surge resistance.

A method for manufacturing the planer MOSFET is described below with reference to FIGS. 2A to 2D and FIGS. 3A to 3D in accordance with the present embodiment.

Figure 2A:
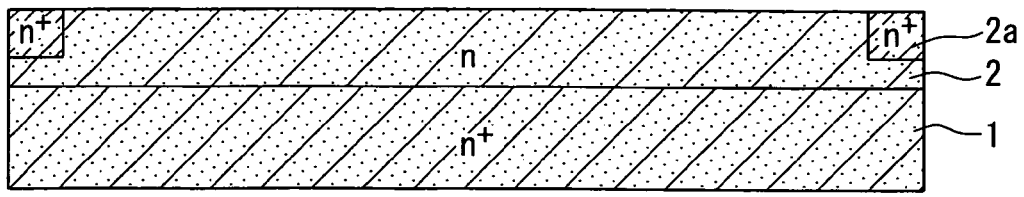
FIGS. 2A to 2D are cross sectional diagrams illustrating manufacturing processes of the planer MOSFET illustrated in FIG. 1.

Processes associated with FIG. 2A are described. A substrate 1 having an n+ conductivity type is prepared. A part of an n type drift layer 2 is epitaxially grown on a principal surface of the substrate 1 so that the part of the n type drift layer 2 has an impurity concentration of about $1 \times 10^{16}$ cm$^{-3}$ and a thickness of about 4 μm. A resist is deposited and patterned. By using the resist, a surface of the n type drift layer 2 is partially removed to form an alignment key having a depth of, for example, 0.5 μm. The alignment key is used for alignment in post-process. A mask is deposited. The mask is, for example, a low temperature oxide (LTO) layer and has a thickness of 2 μm. An opening is made on the mask via a photolithography process so that the opening is located above a region where an n+ type region 2a is supposed to be formed. N type impurity (e.g., P: Phosphorus ions) are implanted into a surface portion of the n type drift layer 2 by using the mask. After removing the mask, an active annealing process is performed for about 30 minutes at about 1600 degrees C. Through the above processes, the n+ type region 2a is formed that has an impurity concentration greater than or equal to $1 \times 10^{17}$ cm$^{-3}$ and a thickness of about 0.3 μm. The impurity concentration is, for example, about $1 \times 10^{19}$ cm$^{-3}$.

Figure 2B:
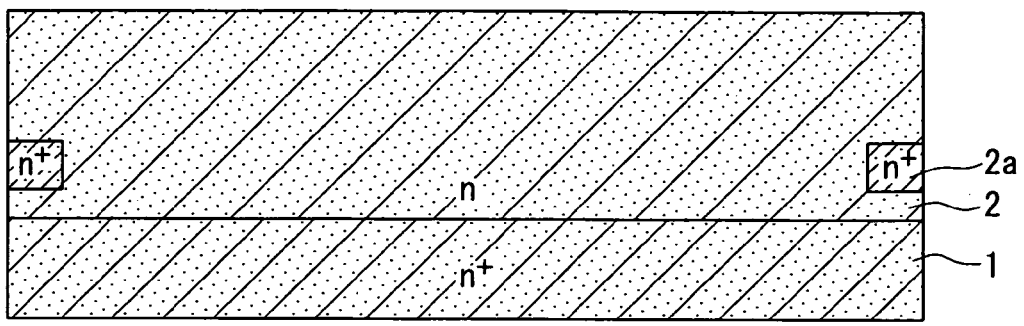

Processes associated with FIG. 2B are described. Deposition of the n type drift layer 2 is performed again so as to form a rest part of the n type drift layer 2. The rest part of the n type drift layer 2 is formed so as to have an impurity concentration of about $1 \times 10^{16}$ cm$^{-3}$ and a thickness of about 6 μm. Through the above processes, the n type drift layer 2 is formed that has a thickness of about 10 μm, and the n+ type region 2a is formed that is located at an about 6 μm to 6.3 μm depth position in the n type drift layer 2.

In the processes associated with FIG. 2A, the active annealing process is performed. Alternatively, the active annealing process may be simultaneously performed by using a heat in depositing the rest part of the n type drift layer 2 in the processes associated with the processes FIG. 2B.

Figure 2C:
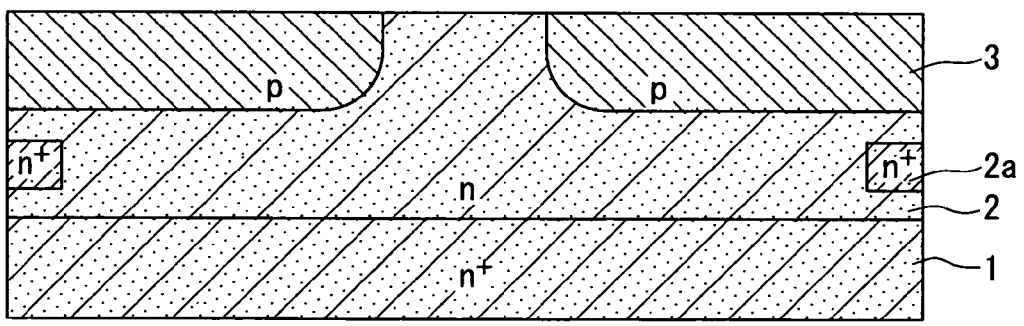

Processes associated with FIG. 2C are described. A mask such as LTO or the like is deposited again. An opening is made on the mask so that the opening is located above a region where the p type base region is supposed to be formed. P type impurities (e.g., Al ions) are implanted into a surface portion of the n type drift layer 2 by using the mask. After removing the mask, an active annealing process is performed for about 30 minutes at about 1600 degrees C. Through the above processes, the p type base region 3 is formed that has an impurity concentration of about $1 \times 10^{19}$ cm$^{-3}$ and a depth (i.e., a thickness) of about 0.7 μm.

Figure 2D:
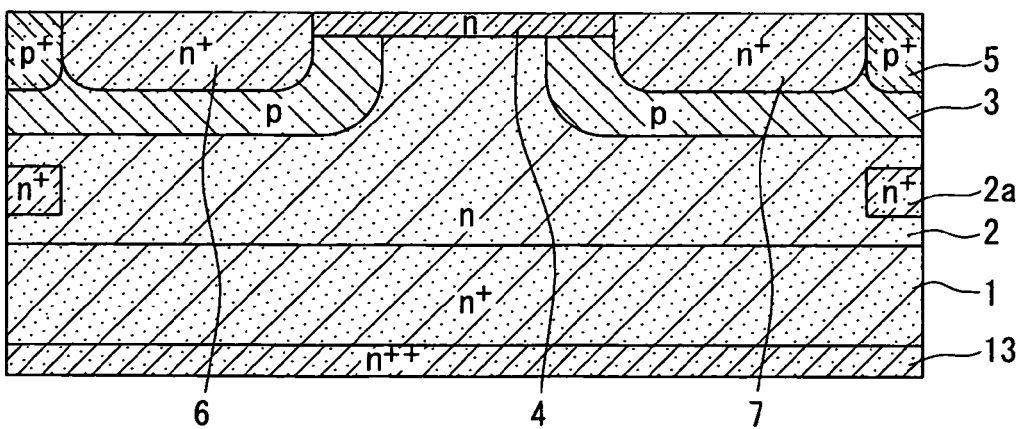

Processes associated with FIG. 2D are described. A channel epitaxial layer 4 is epitaxially grown on the p type base region 3, so that the channel epitaxial layer 4 has an impurity concentration of about $1 \times 10^{16}$ cm$^{-3}$ and a layer thickness (i.e., a depth) of about 0.3 μm. A mask such as LTO or the like is deposited. An opening is made on the mask via a photolithography process so that the opening is located above a region where a contact region 5 is supposed to be formed. Al ions are implanted by using the mask. After removing the mask, another mask such as LTO or the like is deposited to protect the surface of the substrate. P ions are implanted into a rear surface portion of the substrate. After removing the mask, another mask is deposited again. Openings are made on the mask via a photolithography process so that the openings are located above regions where n+ type source regions 6, 7 are supposed to be formed. N type impurities, which are for example P ions, are implanted. After removing the mask, an active annealing process is performed for about 30 minutes at about 1600 degrees C. to activate the implanted p type and n type impurities. Through the above processes, the contact region 5, the n+ type source regions 6, 7, and the drain contact region 13 are formed.

Figure 3A:
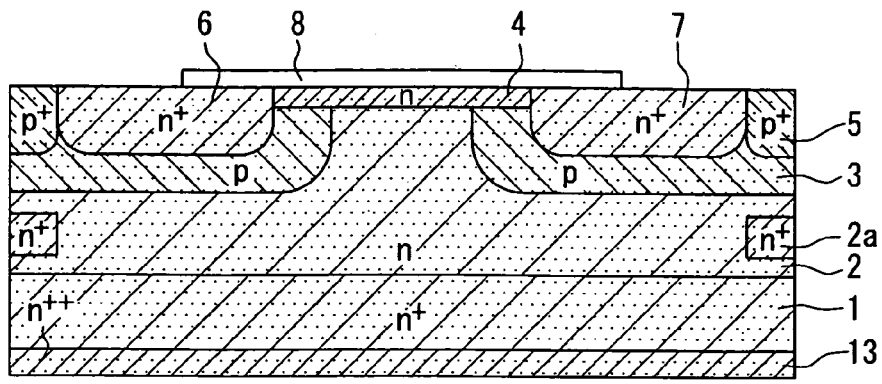
FIGS. 3A to 3D are cross sectional diagrams illustrating manufacturing processes of the planer MOSFET in FIG. 1, the processes being performed after those shown in FIGS. 2A to 2D.

Processes associated with FIG. 3A are described. A gate oxide film formation process is performed to form a gate oxide film 8. For example, a gate oxide layer is formed via gate oxidation by using a pyrogenic technique employing a wet atmosphere.

Figure 3B:
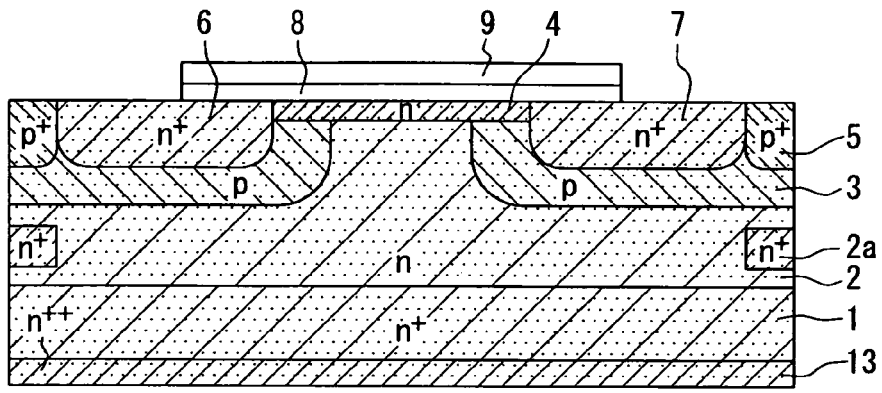

Processes associated with FIG. 3B are described. A polysilicon layer doped with n type impurities is deposited on a surface of the gate oxide film 8 under temperature condition of about 600 degrees C., so that the polysilicon layer has a thickness of about 440 nm. Then, the polysilicon layer and the gate oxide film 8 are patterned by using a resist as a mask, the resist being formed via a photolithography etching. Through the above processes, a gate electrode 9 is formed.

Figure 3C:
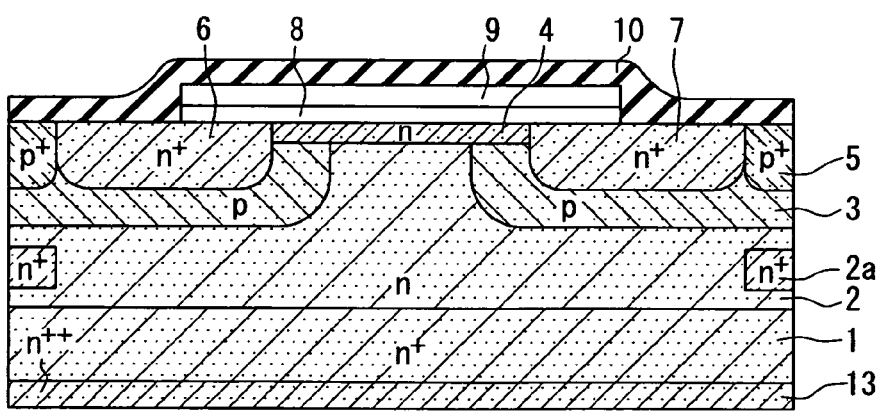

Processes associated with FIG. 3C are described. An interlayer insulation film 10 is deposited. For example, a borophospho silicate glass (BPSG) having a thickness of about 670 nm is deposited by plasma chemical vapor deposition (CVD) at a temperature of about 420 degrees C. Then, for example, a reflow process is performed in a wet atmosphere for about 20 minutes at about 930 degrees C. Through the above processes, the interlayer insulation film 10 is formed.

Figure 3D:
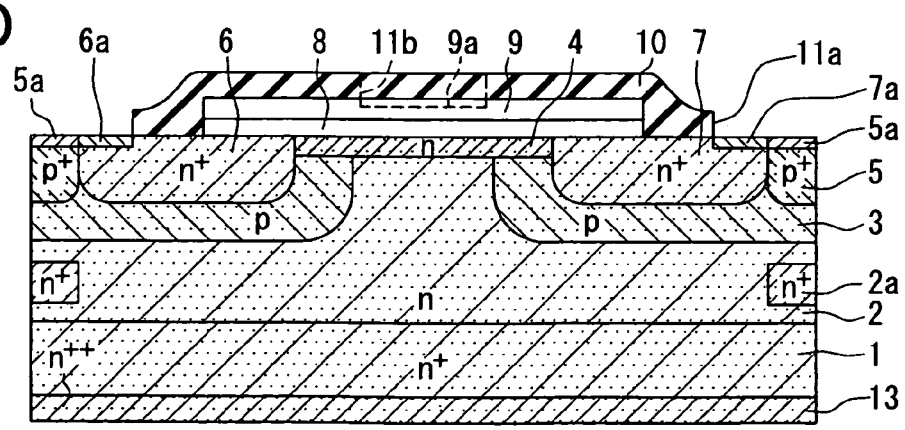

Processes associated with FIG. 3D are described. The interlayer insulation film 10 is patterned in such a manner that the patterning is performed by using a resist as a mask, the resist being formed via a photolithography etching. Through the above process, a contact hole 11a communicated with the contact region 5 and the n+ type source regions 6, 7 is formed. Further, a contact hole 11b communicated with the gate electrode 9 is formed. The contact hole 11b may appear on a cross section different from that is illustrated in FIG. 3D.

Processes which are to be performed after the above processes are not shown in the drawings but include the following processes. A contact metal layer made of Ni or Ti/Ni is deposited so as to fill in the contact holes 11a, 11b. Then, the contact metal layer is patterned. The contact members 5a to 7a, 9a are formed so that the contact members 5a to 7a, 9a are respectively electrically connected with the contact region 5, the n+ type source regions 6, 7 and the gate electrode 9. A drain electrode 14 made of Ni is formed on a rear surface side of the substrate 1 so that the drain electrode 14 contacts the drain contact region 13. An electrode sintering process is performed by heat treatment in Ar gas atmosphere at temperatures less than or equal to 700 degrees C. Thereby, each contact member 5a to 7a, 9a, and the drain electrode 14 are provided with ohmic contact. In the above case, the contact region 5, the n+ type source regions 6, 7, the gate electrode 9 and the drain contact region 13 have the above-described high impurity concentrations. Hence, without performing a heat treatment process at a high temperature, it is possible to provide each of the contact members 5a to 7a and the drain electrode 14 with the ohmic contact Then, a source electrode 12 is provided. The source electrode 12 has a base wiring electrode 12a made of Ti and a wiring electrode 12b made of Al. A gate wire is provided, for example, that connect a part appearing on a cross section different from that illustrated in FIG. 1. Through the above processes, the planer MOSFET illustrated in FIG. 1 is manufactured.

In the above-described planer MOSFER, the n+ type region 2a is located in the n type drift layer 2 and located below the contact region 5 so as to be spaced away from the p type base region 3. Due to the above configuration, a breakdown takes places at a corner part 2b of the n+ type region 2a, the corner part 2b being located on an upper side of the n+ type region 2a. A body breakdown can occur between the p type base region 3 and the n+ type region 2a. Since it is possible to prevent carriers generated due to the breakdown from flowing below the n+ type source regions 6, 7, the parasitic transistor provided by the n+ type source regions 6, 7, the p type base region 3 and the n type drift layer 2 does not operate in the surge. It is hence possible to improve the surge resistance. Therefore, the above planer MOSFET is provided with an improved surge resistance.

FIG. 1 illustrates only one cell of the planer MOSFET. However the SiC semiconductor device may include a cell portions having multiple cells of the planer MOSFET. It is preferable that the n+ type region 2a may be formed in each cell of the planer MOSFET included in a cell portion. In the above configuration, multiple n+ type regions 2a are formed in the cell portion. The breakdown can occurs at multiple places, and thereby, a surge resistance is further improved.

Second Embodiment

A second embodiment is described below. An SiC semiconductor device having a planer MOSFET according to the present embodiment is different from that according to the first embodiment in a location of n+ type region 2a.

Figure 4:
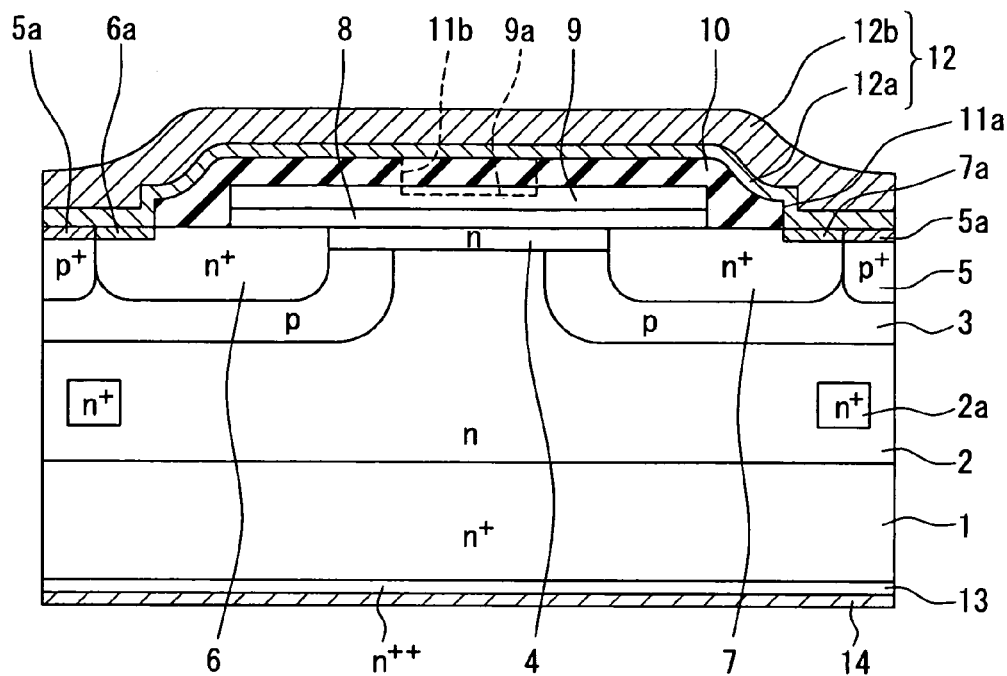
FIG. 4 is a cross sectional diagram illustrating an SiC semiconductor device having a planer MOSFET in accordance with a second embodiment.

FIG. 4 is a cross sectional diagram illustrating the SiC semiconductor device having the planer MOSFET in accordance with the present embodiment. As shown in FIG. 4, each n+ type region 2a is located in the n type drift layer 2, located below the n+ type source region 6, 7, and spaced away from the p type base region 3. Functions of the n+ type regions 2a according to the present embodiment are substantially identical those according to the first embodiment. Effects according to the present embodiment are substantially similar to those according to the first embodiment.

A method for manufacturing the planer MOSFET according to present embodiment is provided when the following change is made in the method according to the first embodiment. The change is that the mask used in forming the n+ type region 2a is properly changed. Regarding other processes, the same processes according to the first embodiment can be employed.

Third Embodiment

A third embodiment is described below. An SiC semiconductor device having a planer MOSFET according to the present embodiment is different from that according to the first embodiment in a location of an n+ type region 2a.

Figure 5:
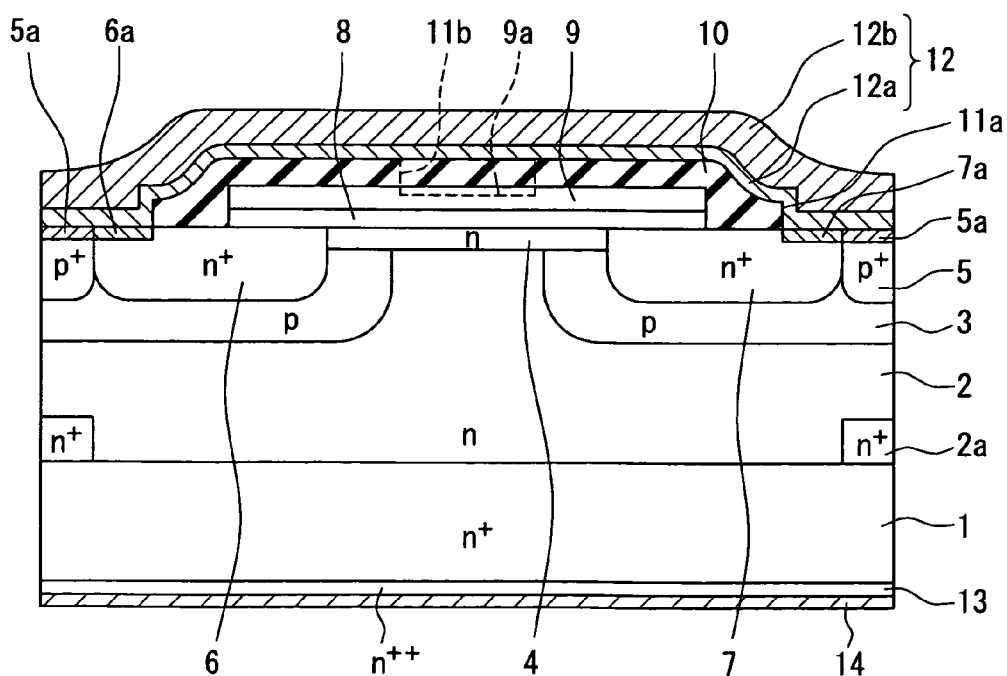
FIG. 5 is a cross sectional diagram illustrating an SiC semiconductor device having a planer MOSFET in accordance with a third embodiment.

FIG. 5 is a cross sectional diagram illustrating the SiC semiconductor device having the planer MOSFET in accordance with the present embodiment. As shown in FIG. 5, each n+ type region 2a is located in the n type drift layer 2, and located below the contact region 5, as similar to the n+ type region 2a according to the first embodiment. In the present embodiment, the n+ type region 2a is in contact with the substrate 1 whereas, in the first embodiment, the n+ type region 2a is spaced away from the substrate 1. Functions of the n+ type regions 2a contacting the substrate 1 according to the present embodiment includes those according to the first embodiment. Effects according to the present embodiment include those according to the first embodiment. Moreover, in the present embodiment, since a current is easier to flow through the n+ type regions 2a, an on-state resistance is reduced.

A method for manufacturing the planer MOSFET according to present embodiment is almost similar to that according to the first embodiment. In the method according to the present embodiment, the following processes may be repeatedly performed to form the n+ type regions 2a at a deep position. A part of the n type drift layer 2 is thinly formed and n type impurities are implanted. Alternatively, the following processes may be performed to form the n+ type regions 2a. A part of the n type drift layer 2 having a thickness of about 4 µm is formed. Then, the n type drift layer 2 is partially etched to form trenches having a depth of about 4.5 µm so that a location of the trench corresponds to a region where the n+ type region 2a is supposed to be form. Then, an n+ type layer is deposited. Then, a surface of the n+ type region 2a is polished and flattened until the n type drift layer 2 is exposed, so that the n+ type layer 2a remains only in the trench.

Fourth Embodiment

A fourth embodiment is described below. An SiC semiconductor device having a trench gate MOSFET according to the present embodiment includes a configuration similar to that according to the first embodiment.

Figure 6:
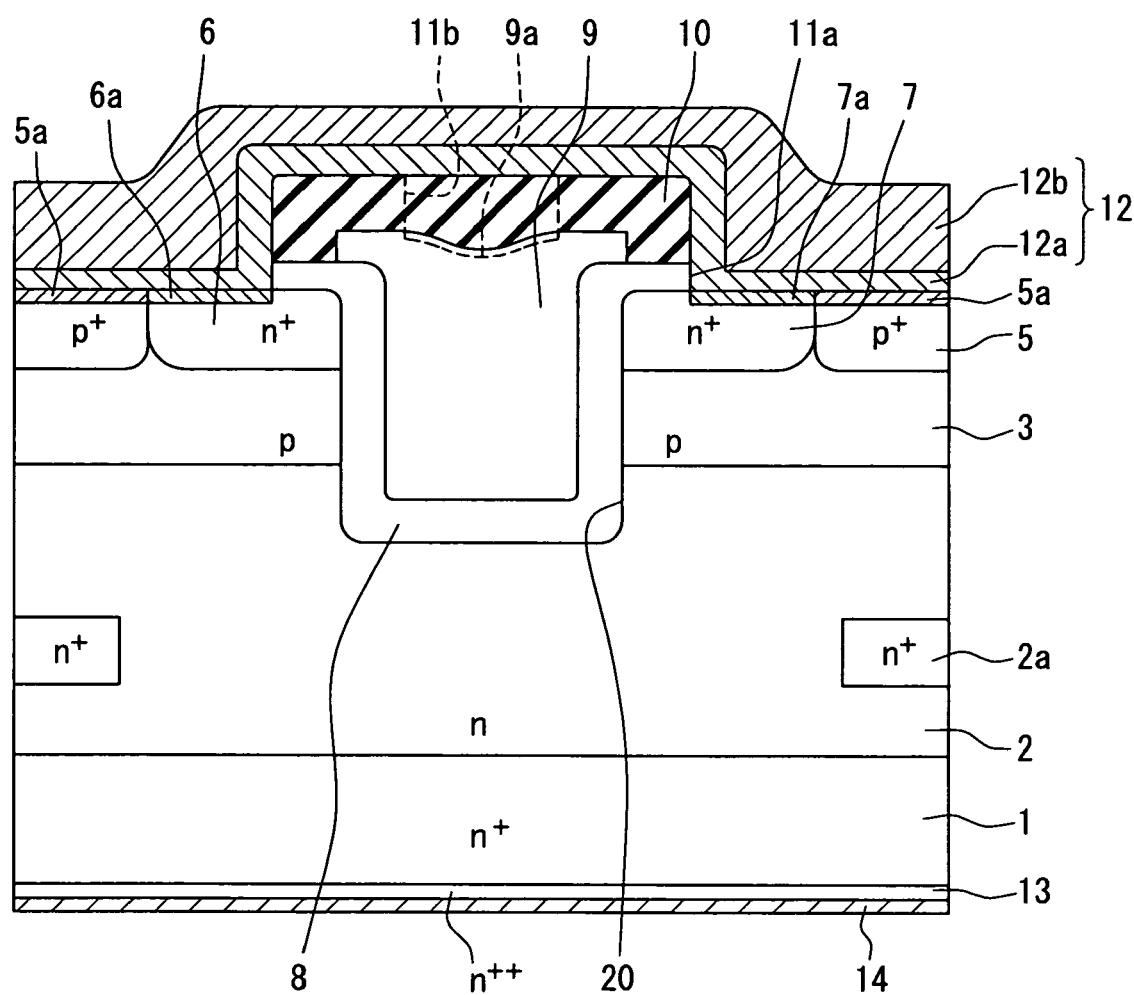
FIG. 6 is a cross sectional diagram illustrating an SiC semiconductor device having a trench gate MOSFET in accordance with a fourth embodiment.

FIG. 6 is a cross sectional diagram illustrating the SiC semiconductor device having the trench gate MOSFET in accordance with the present embodiment. As shown in FIG. 6, an n type drift layer 2 is located and formed on a principal surface of a substrate 1 having n+ conductivity type. A p type base region 3 is located and formed in a surface portion of the n type drift layer 2. N+ type source regions 6, 7 are located in a surface portion of the p type base region 3, and spaced away from each other by a trench 20.

A trench 20 penetrates from a surface of the n type drift layer 2 through the n+ type source regions 6, 7 and the p type base region 3. The trench 20 extends below the p type base region 3 and reaches the n type drift layer 2. A side wall of the trench 20 contacts the n+ type source regions 6, 7 and the p type base region 3. The contact regions 5 having the p+ conductivity type are located on opposite sides of the trench 20 through the n+ type source regions 6, 7. The n+ type source region 6 is located between one contact region 5 and the trench 20. The n+ type source region 7 is located between another contact region 5 and the trench 20.

A gate oxide film 8, which has a thickness of, for example, 52 nm, is formed and located on an inner wall of the trench 20. A part of the p type base region 3 located adjacent to the gate oxide film 8 provides a channel region. That is, a part of the p type base region 3 contacting the side wall of the trench 20 provides a channel region. A gate electrode 9 is disposed on a surface of the gate oxide film. The gate electrode 9 is made of polysilicon doped with n type impurities (e.g., P or N). The trench 20 is filled with the gate electrode 9.

An interlayer insulation film 10 is formed and located so as to cover a rest part of the gate electrode 9 and the gate oxide film 8. The interlayer insulation film 10 is made of, for example, BPSG. Contact holes 11a, 11b are formed and located in the interlayer insulation film 10 and the gate oxide film 8. The contact hole 11a is communicated with the n+ type source regions 6, 7. The contact hole 11b is communicate with the gate electrode 9. Contact members 5a, 6a are located in the contact hole 11a. A contact member 9a is located in the contact hole 11b. A source electrode 12 and a gate line are located in the contact holes 11a, 11b. The source electrode 12 is electrically connected with the n+ type source regions 6, 7. The gate line is electrically connected with the gate electrode 9. A drain electrode 14 is located and formed on a rear surface of the substrate 1.

An n+ type region 2a is located in the n type drift layer 2 and located below the contact region 5. More specifically, the n+ type region 2a is located below a portion that is located opposite to the trench 20 with respect to the n+ type source region 6, 7, and further, the n+ type region 2a is located below a portion of the p type base region 3 that is electrically connected to the source electrode 12. For example, the n+ type region 2a has a high impurity concentration greater than or equal to $1 \times 10^{17}$ $cm^{-3}$. The trench gate MOSFET according to the present embodiment has the above configuration.

The trench gate MOSFET according to the present embodiment and the planer MOSFET according to the first embodiment are similar in respect of the presence of the n+ type regions 2a. Functions of the n+ type regions 2a of the trench gate MOSFET according to the present embodiment are substantially identical those according to the first embodiment. Effects according to the present embodiment are substantially similar to those according to the first embodiment.

A method for manufacturing the above trench gate MOSFET according to the present embodiment is different from that for manufacturing a typical trench gate MOSFET in processes for forming the n+ type regions 2a. The processes associated with FIG. 2A according to the first embodiment can be employed as the processes for forming the n+ type regions according to the present embodiment.

Fifth Embodiment

A fifth embodiment is described below. An SiC semiconductor device having a trench gate MOSFET according to the present embodiment is different from that according to the fourth embodiment in a configuration and a location of an n+ type region 2a.

Figure 7:
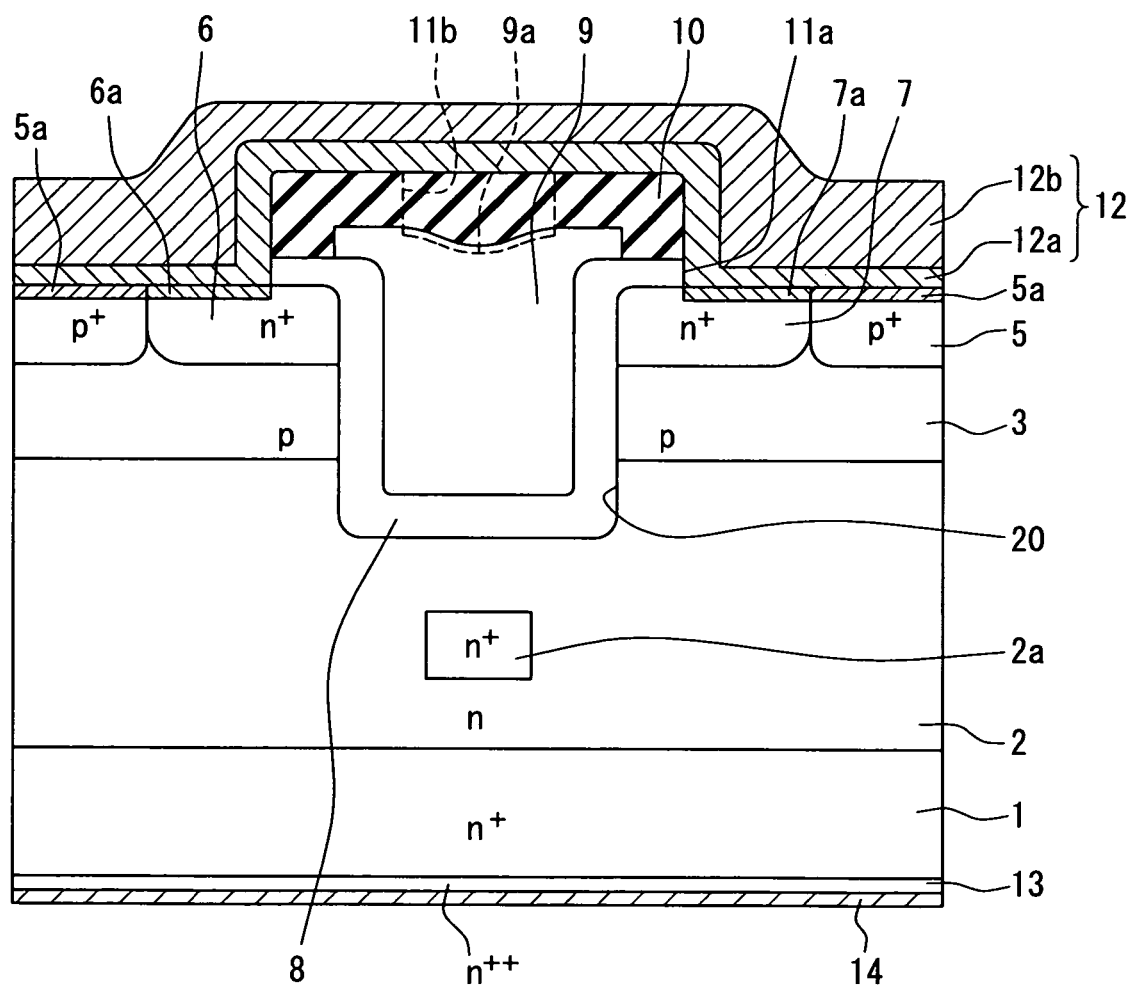
FIG. 7 is a cross sectional diagram illustrating SiC semiconductor device having a trench gate MOSFET in accordance with a fifth embodiment.

FIG. 7 is a cross sectional diagram illustrating the SiC semiconductor device having the trench gate MOSFET in accordance with the present embodiment. As shown in FIG. 7, the n+ type region 2a is located below the trench 20 and spaced away from a bottom of the trench 20. Other configurations of the trench gate MOSFET according to the present embodiment is generally similar to those according to the fourth embodiment.

The trench gate MOSFET according to the present embodiment includes the n+ type regions 2a, as similar to the planer MOSFET according to the first embodiment. Functions of the n+ type regions 2a of the trench gate MOSFET according to the present embodiment are substantially identical to those according to the first embodiment. Effects according to the present embodiment are substantially similar to those according to the first embodiment.

A method for manufacturing the trench gate MOSFET according to present embodiment is provided when the following change is made in the method according to the fourth embodiment. The change is that a pattern of the mask used in forming the n+ type region 2a is properly changed.

Figure 8:
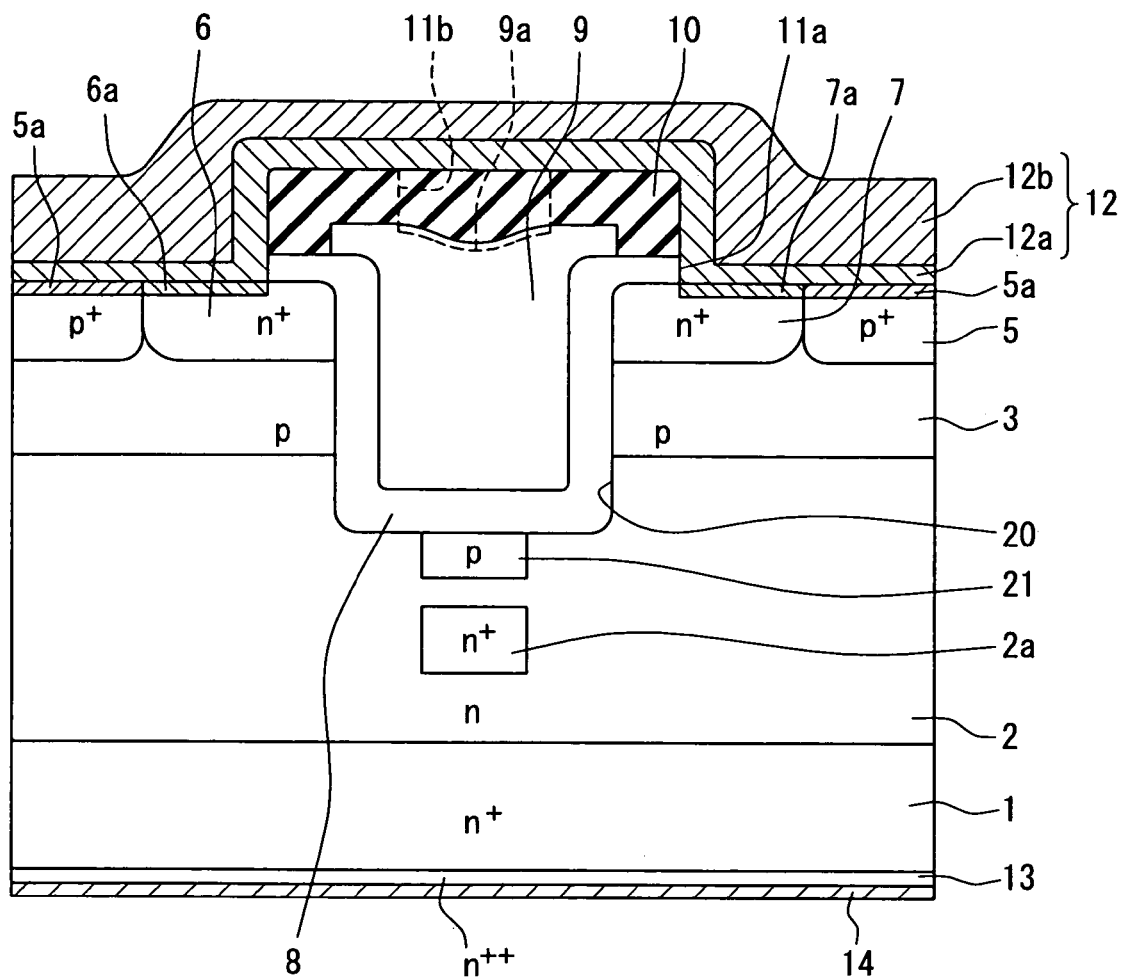
FIG. 8 is a cross sectional diagram illustrating SiC semiconductor device having a trench gate MOSFET in accordance with a modification of the fifth embodiment.

As shown in FIG. 8, the trench gate MOSFET according to the present embodiment may further includes a p+ type region 21, which contacts the bottom of the trench 20. When the trench gate MOSFET has the p+ type region 21, electric field concentration at both corner parts 20a of the trench 20 can be suppressed. In a case of surge, it is possible to prevent the gate oxide film 8 from being destroyed at the corner part 20a of the trench 20.

Sixth Embodiment

A sixth embodiment is described below. In the present embodiment, a configuration associated with the first embodiment is applied to an SiC semiconductor device having a Schottky barrier diode (SBD).

Figure 9:
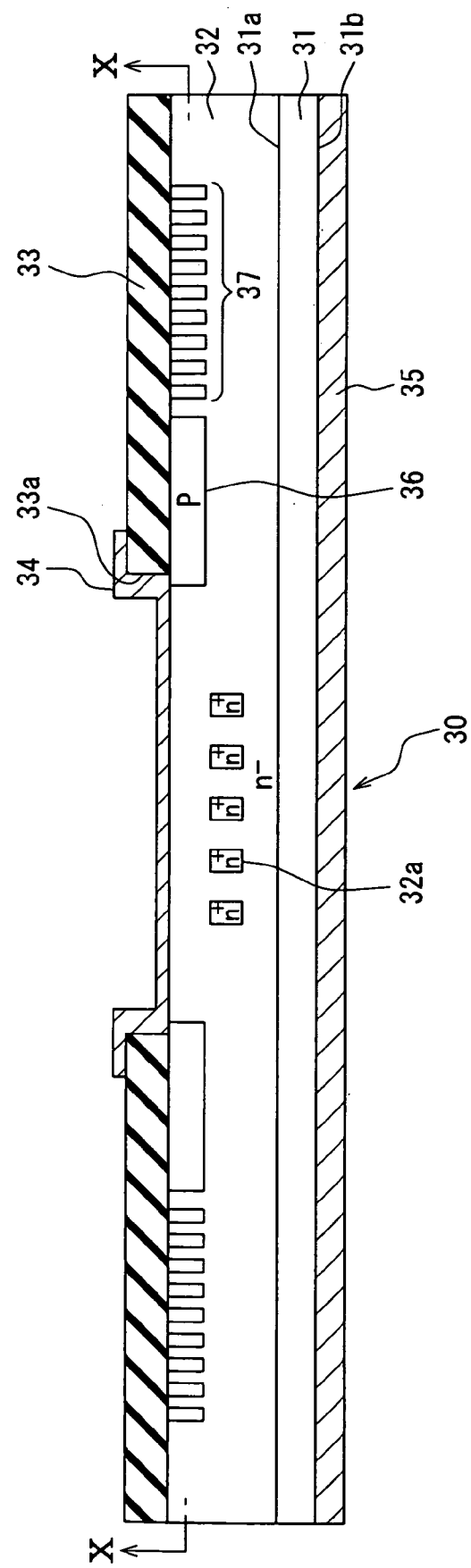
FIG. 9 is a cross sectional diagram taken along line IX-IX in FIG. 10 and illustrating an SiC semiconductor device having an SBD in accordance with a sixth embodiment.
Figure 10:
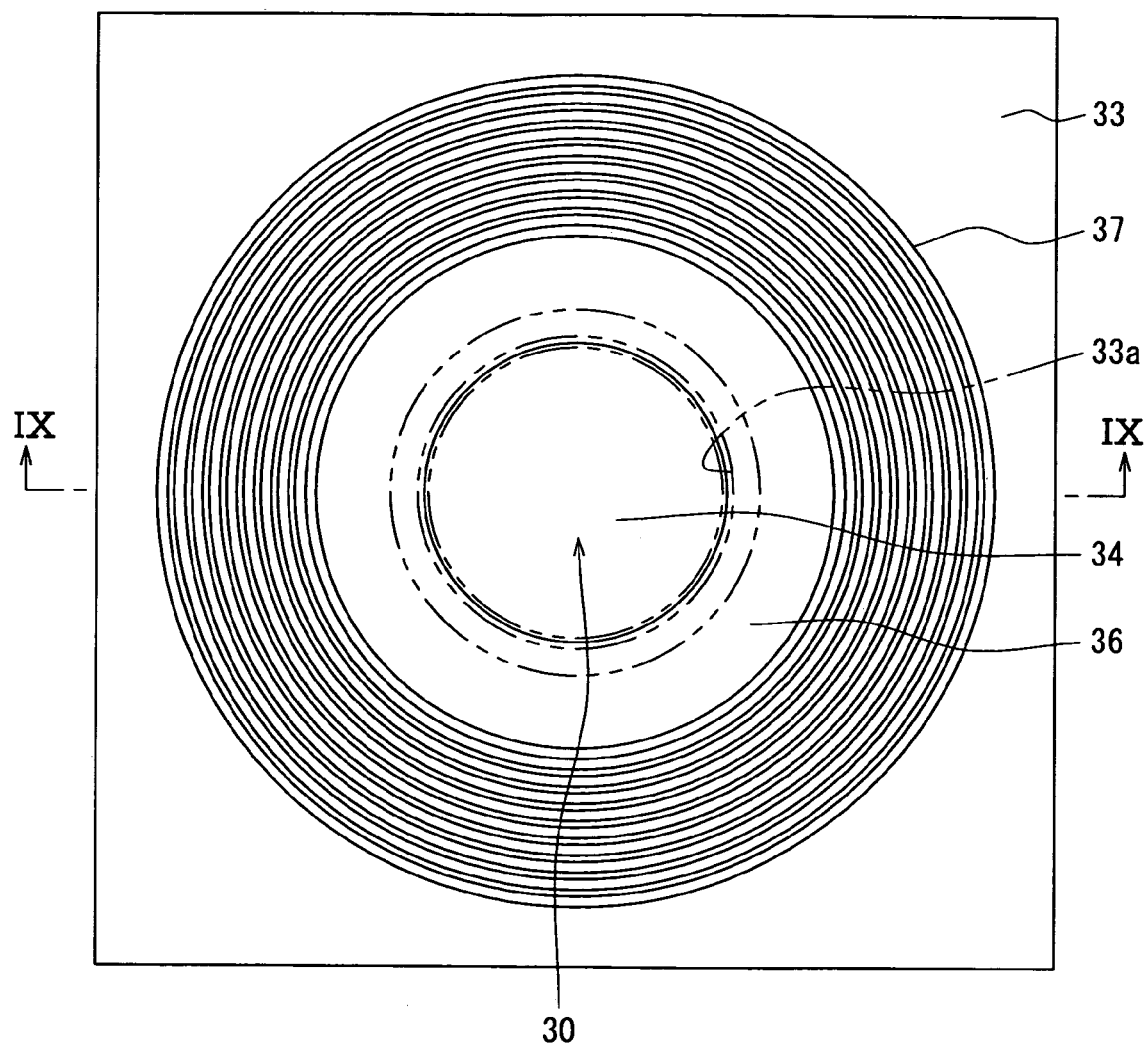
FIG. 10 is a cross sectional diagram taken along line X-X in FIG. 9 and illustrating the SiC semiconductor device in accordance with the sixth embodiment.

FIG. 9 is a cross sectional diagram taken along line IX-IX in FIG. 10, the diagram illustrating an SiC semiconductor device having SBD 30 in accordance with the present embodiment. FIG. 10 is a cross sectional diagram taken along line X-X in FIG. 9 and illustrating the SiC semiconductor device in accordance with the sixth embodiment.

As shown in FIG. 10, the SiC semiconductor device according to the present embodiment includes a substrate 31 made of silicon carbide. For example, the substrate 31 has an n+ conductivity type and has an impurity concentration of about between $2 \times 10^{18}$ $cm^{-3}$ and $1 \times 10^{21}$ $cm^{-3}$. The substrate 31 has a principal surface 31a and a rear surface 31b opposite to each other. An n type drift layer 32 made of silicon carbide is deposited and located on the principal surface 31a of the substrate 31. An impurity concentration of the n type drift layer 32 is smaller than that of the substrate 31, and is for example about $5 \times 10^{15}$ $cm^{-3}$. The substrate 31 and the n type drift layer 32 provide a cell portion. The SiC semiconductor device includes an SBD 30 formed and located in the cell portion. The SiC semiconductor device further includes a termination structure at a periphery of the cell portion.

More specifically, an insulation film 33 is formed and located on a surface of the n type drift layer 32. The insulation film 33 has an opening 33a at the cell portion, and is provided by, for example, a silicon oxide film. A Schottky electrode 34 is formed so as to contact the n type drift layer 32 through the opening 33a of the insulation film 33. The Schottky electrode 34 is made of, for example, molybdenum (Mo), titanium (Ti), or the like. The opening 33a of the insulation film 33 has a generally circular shape, as shown in FIG. 10. The Schottky electrode 34 and the n type drift layer 32 have Schottky contact with each other in the circular opening 33a. An ohmic electrode 35 is formed and located so as to contact the rear surface of the substrate 31. The ohmic electrode 35 is made of, for example, nickel (Ni), titanium (Ti), molybdenum (Mo), tungsten (W), or the like. The SBD 30 is provided with the above configuration.

The termination structure located at the periphery of the SBD includes a p type resurf layer 36 and multiple p type guard ring layers 37. The p type resurf layer 36 is formed in a surface portion of the n type drift layer 32 so that the p type resurf layer 36 contacts the Schottky electrode 34 at both ends of the Schottky electrode 34. The multiple guard ring layers 37 are arranged so that each guard ring layer 37 surrounds a periphery of the p type resurf layer 36. For example, the p type resurf layer 36 contains Al as impurities and has an impurity concentration of about between $5 \times 10^{16}$ $cm^{-3}$ and $1 \times 10^{18}$ $cm^{-3}$. As shown in FIG. 10, each of the p type resurf layer 36 and the guard ring layers 37 has a generally ring shape so as to surround the cell portion. The presence of the p type resurf layer 36 and the guard ring layers 37 causes an electric filed to extend to a wide region in the periphery of the SBD, and causes electric field concentration to be relaxed. As a result, it is possible to improve a breakdown voltage.

The SiC semiconductor device includes an n+ type region 32a, which is located below the Schottky electrode 34 in the cell portion. More specifically, the n+ type region 32a is located below a part of the Schottky electrode 34, the part being in contact with the n type drift layer 32. The n+ type region 32a is located at a position deeper than the p type resurf layer 36. An impurity concentration of the n+ type region 32a is larger than that of the n type drift layer 32. It is preferable that multiple n+ type regions 32a are formed and arranged in a point symmetric manner with respect to a center part of the cell portion. Alternatively, only single n+ type region 32a may be formed and located at the center part of the cell portion. In the present embodiment, five n+ type regions 32a are arranged in a row on a cross section shown in FIG. 9. Alternatively, the number of the n+ type regions 32a may be another number other than five, for example, more than five.

The SiC semiconductor device according to the present embodiment includes the n+ type region 32a, as similar to the planer MOSFET according to the first embodiment. In a case of surge, the presence of the n+ type region 32a causes electric filed concentration to occur at corner parts 32b of the n+ type region 32a on an upper side, and an avalanche breakdown takes place. When a surge energy is large in the above case, a breakdown region spreads across the upper side of the n+ type region 32a, that is, the breakdown region spreads across a region between the corner parts 32b at which the avalanche breakdown has took place. Therefore, a surge resistance improves, as in the planer MOSFET according to the first embodiment.

When the multiple n+ type regions 2a are provided in the cell portion of the SBD 30, the places where avalanche breakdown take places can increase. As a result, it is possible to further improve the surge resistance.

Seventh Embodiment

A seventh embodiment is described below. An SiC semiconductor device according to the present embodiment includes the SBD 30 illustrated in the sixth embodiment, and further includes a Junction Barrier Schottky Diode (JBS), which is provided by P-N junction in the cell portion.

Figure 11:
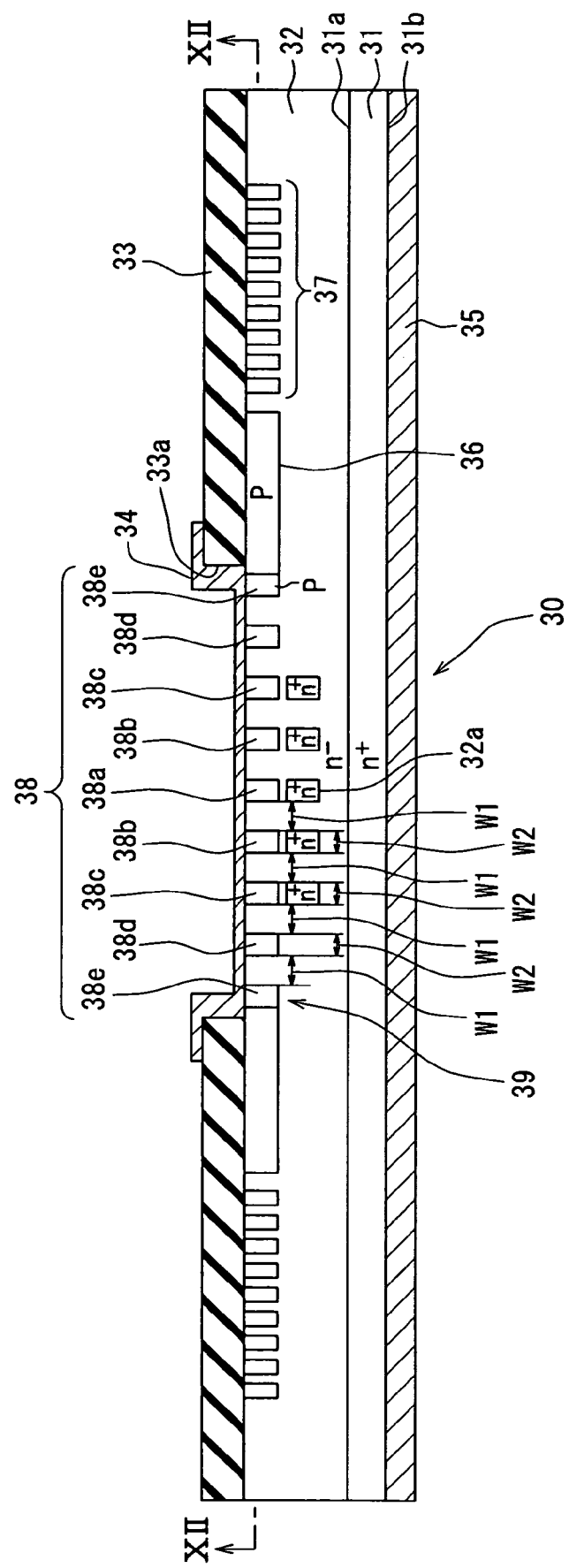
FIG. 11 is a cross sectional diagram taken along line XI-XI in FIG. 12 and illustrating an SiC semiconductor device in accordance with a seventh embodiment.
Figure 12:
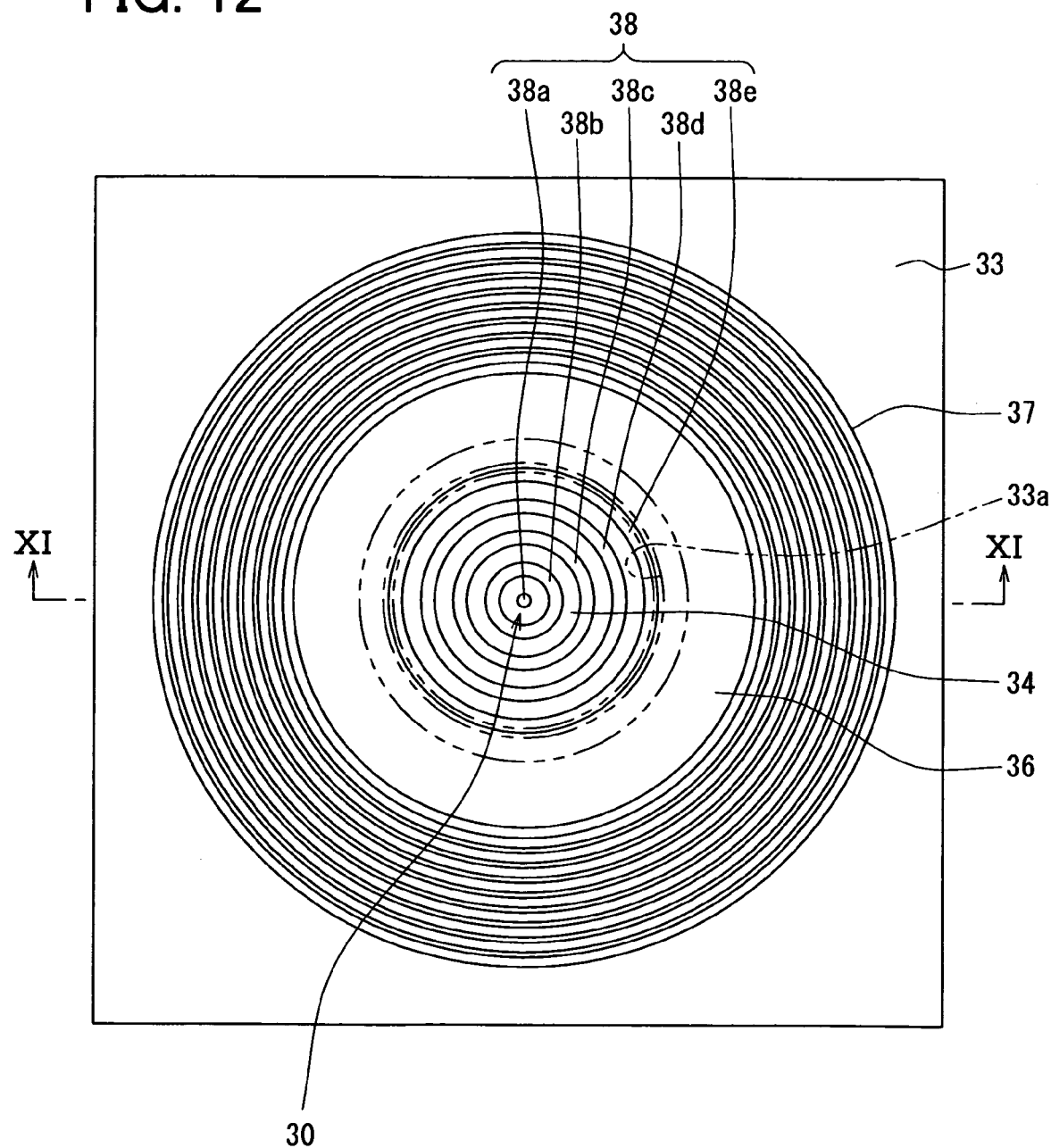
FIG. 12 is a cross sectional diagram taken along line XII-XII in FIG. 11 and illustrating the SiC semiconductor device in accordance with the seventh embodiment.

FIG. 11 is a cross sectional diagram taken along line XI-XI in FIG. 12, the diagram illustrating an SiC semiconductor device in accordance with the present embodiment. FIG. 12 is a cross sectional diagram taken along line XII-XII in FIG. 11 and illustrating the SiC semiconductor device in accordance with the seventh embodiment.

As shown in FIGS. 11 and 12, a p type layer 38 is located so as to contact the Schottky electrode 34, and located inward of an inner perimeter of the p type resurf layer 36 that is located on an utmost cell portion side among elements of the termination structure. The p type layer and the n type drift layer 32 provides the P-N junction and the JBS 39.

The p type layer 38 includes a center member 38a and multiple ring members 38b to 38e. The center member 38a has a generally circular shape, an outer perimeter of which is similar to the outer perimeter of the cell portion (i.e., the outer perimeter of the Schottky electrode 34) in shape. Each multiple ring member 38b to 38e has a generally circular ring shape, a shape of perimeter of which is similar to that of outer perimeter of the cell portion (i.e., the outer perimeter of the Schottky electrode 34). The multiple ring members 38b to 38e are arranged in a concentric pattern with respect to the center member 38a. In the present embodiment, the number of the ring members 38b to 38e is four. An outermost ring member 38e, which is located outermost from the center member 38a among the ring members 38b to 38e, is in contact with an inner peripherical surface of the p type resurf layer 36. Alternatively, the outermost ring member 38e may be embedded in the p type resurf layer 36. The ring members 38b to 38d, which are located between the center member 38a and the outermost ring member 38e, are intermediate ring members 38b to 38d. The ring members 38b to 38e are arranged at space intervals W1 and have an equal width of W2, so that cross section of the intermediate ring members 38b to 38d radially taken along a plane with respect to the center member 38a are symmetrically arranged. For example, each p type layer 38 has an impurity concentration of about between $5 \times 10^{17}$ cm$^{-3}$ and $1 \times 10^{20}$ cm$^{-3}$. The space interval W1 between the adjacent p type layers 38 is in a range about between 1.5 μm and 2.5 μm. The width W2, which is a radial length of each ring member as shown in FIG. 12, is in a range between about 1.0 μm and 2.0 μm. A depth (i.e., a thickness) is in a range 0.3 μm and 1.0 μm.

In the SiC semiconductor device having the SBD 30 and the JBS 39, a current flow between the Schottky electrode 34 and the ohmic electrode 35 when a voltage exceeding the Schottky barrier is applied to the Schottky electrode 34 in a state where the Schottky electrode and the ohmic electrode 35 respectively function an anode and a cathode.

In a case of an off state, a depletion layer extends toward the n type drift layer 32 from the multiple p type layers 38 located below the Schottky electrode 34. As a result, parts of the n type drift layer 32 located between the p type layers 38 is almost completely depleted. It is therefore possible to reduce a leakage current when a reverse voltage is applied.

In the SiC semiconductor device having the SBD 30 and the JBS 39, the n+ type regions 32a are spaced away from the p type layers 38 and has an impurity concentration greater than or equal to the n type drift layer 32, as is similar to the plane MOSFET according to the first embodiment. Functions of the n+ type regions 32a according to the present embodiment are substantially identical the n+ type regions 2a according to the first embodiment. Effects according to the present embodiment are substantially similar to those according to the first embodiment.

Eighth Embodiment

An eighth embodiment is described below. An SiC semiconductor device according to the present embodiment includes a P-N diode and includes a configuration similar to that according to the first embodiment.

Figure 13:
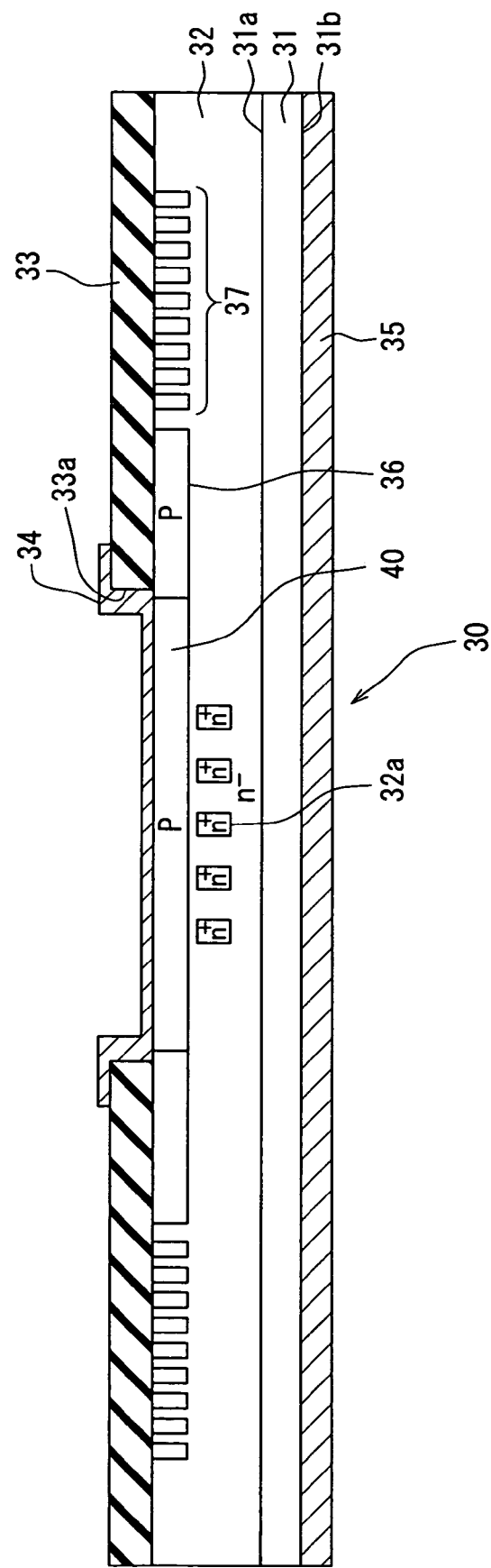
FIG. 13 is a cross sectional diagram illustrating an SiC semiconductor device having a P-N diode in accordance with an eighth embodiment.

FIG. 13 is a cross sectional diagram illustrating a SiC semiconductor device including a P-N diode in accordance with the present embodiment.

As shown in FIG. 13, a p type layer 40 is formed in a surface portion of the n type drift layer 32 in the cell portion. The P type layer 40 and the n type drift layer 32 provides a P-N diode 41. The P type resurf layer 36 contacts and surrounds the p type layer 40. Each guard ring layers 37 surrounds the p type resurf layer 36. In the present embodiment, an ohmic electrode 42 is used in place of the Schottky electrode 34 employed in the second embodiment. The ohmic electrode 42 contacts the p type layer 40 through the circular opening 33a of the insulation film 33. The ohmic electrode 42 and the p type layer 40 are connected by ohmic contact.

An n+ type region 32a is located in the cell portion and located below the ohmic electrode 42. More specifically, the n+ type region 32a is located below a portion of the ohmic electrode 42, the portion being in contact with the n type drift layer 32. Further, the n+ type region 32a is spaced away from the p type layer 40. The n+ type regions 32a have an impurity concentration larger than the n type drift layer 32. It is preferable that multiple n+ type regions 32a are formed in the cell portion and arranged in a point symmetric manner with respect to a center part of the cell portion. Alternatively, only single n+ type region 32a may be formed and located at the center part of the cell portion. In the present embodiment, five n+ type regions 32a are arranged in a row on a cross section shown in FIG. 13. Alternatively, the number of the n+ type regions 32a may be another number other than five, for example, more than five.

The SiC semiconductor device according to the present embodiment includes the n+ type region 32a, as is the case for the planer MOSFET according to the first embodiment. In a case of surge, the presence of the n+ type region 32a can cause electric filed concentration to occur at corner parts 32b of the n+ type region 32a on an upper side, and an avalanche breakdown takes place. When a surge energy is large in the above case, a breakdown region spreads across the upper side of the n+ type region 32a, that is, the breakdown region spreads across a region between the corner parts 32b at which the avalanche breakdown has took place. Therefore, a surge resistance improves, as is the case for the planer MOSFET according to the first embodiment.

When the cell portion of the SBD 30 includes the multiple n+ type regions 32a, an avalanche breakdown can take place at many points. It is hence possible to further improve a surge resistance.

Other Embodiments

In the above embodiments, the silicon carbide semiconductors are described in which the n conductivity type and the p conductivity type respectively correspond to a first conductivity type and a second conductivity type. Alternatively, in the above embodiments, the conductivity type of each element can be reversed.

In the above embodiments, the n+ conductivity type region 2a, 32a may have multiple n+ conductivity type regions 2a, 32a spaced away from each other and arranged substantially parallel to the surface of the substrate 1, 31. In such a case, it is possible to increases places where the breakdown occurs, and as a result, it is possible to increase a surge resistance.

In the above embodiments, the n+ conductivity type region 2a, 32a may be in contact with the substrate 1, 31. In the above configuration, since it become possible for a current to easily flow, it is possible to increase a surge resistance.

In the above embodiments, the n+ conductivity type region 2a, 32a may have an impurity concentration greater than or equal to $1 \times 10^{17}$ cm$^{-3}$.

In the above each embodiment, the SiC semiconductor device having a major element is described as an example. Alternatively, an SiC semiconductor device having another element can have an n+ type region 2a in accordance with the above manners to improve a surge resistance. The another element is, for example, an Insulated Gate Bipolar Transistor (IGBT), Junction Field-Effect Transistor (J-FET), or the like. For example, to provide that the SiC semiconductor device having an IGBT, a conductivity type of a substrate 1 may be changed into a p conductivity type from an n conductivity type shown in the first to sixth embodiments. In the above case, the conductivity type in each element can be reversed.

In each of the first, second and third embodiments, explanation is given on the SiC semiconductor device having an accumulation type planer MOSFET by using examples. Alternatively, in each of the first, second and third embodiments, the SiC semiconductor device may alternatively include an inversion type planer MOSFET. In each of the fourth, fifth and sixth embodiments, explanation is given on the SiC semiconductor device having an inversion type trench gate MOSFET by using examples. Alternatively, in each of the fourth, fifth and sixth embodiments, the SiC semiconductor device may include an accumulation type trench gate MOSFET. To provide the inversion type planer MOSFET, the following changes may be required in each of the first, second and third embodiments. The channel epitaxial layer 4 shown in FIG. 1 is removed. The gate oxide film 8 is directly formed and located on the surface of the p type base region 3. A portion of the p type base region 3 that is in contact with the gate oxide film 8 provides a channel region. To provide the accumulation type trench gate MOSFET, the following changes may be required in the fourth, fifth and sixth embodiments. The n type channel epitaxial layer 4 shown in FIG. 1 is placed on the side wall of the trench 20 in FIG. 6. The n+ type source regions 6, 7 are formed and placed so as to contact the side wall of the trench 20. Further, the channel epitaxial layer 4 is placed between the n+ type source regions 6, 7 and the n type drift layer 2. In the above configuration, a current can flow through the channel epitaxial layer 4 contacting the side wall of the trench 20.

In each of the above sixth, seventh and eighth embodiments, explanation is given on the layout of the SBD 30, the layout of the P-N diode 41 and the number of the P type layers by using examples. However, the layouts and the number can be modified in various ways. For example, the opening 33a of the insulation film 33 may have a generally square shape with rounded corners so that the SBD 30 or the P-N diode 41 has a generally square shape with rounded corners. Further, the Schottky electrode also may have a generally square shape with rounded corners in accordance with the shape of the SBD 30.

It should be noted that, when an orientation of a crystal face is described, a line (i.e., bar) is drawn above numbers in usual notation. However, the line is drawn before the numbers in the above description because of word-processor capability.

While the invention has been described above with reference to various embodiments thereof, it is to be understood that the invention is not limited to the above described embodiments and construction. The invention is intended to cover various modification and equivalent arrangements. In addition, while the various combinations and configurations described above are contemplated as embodying the invention, other combinations and configurations, including more, less or only a single element, are also contemplated as being within the scope of embodiment.

What is claimed is:

1. A silicon carbide semiconductor device having a vertical type semiconductor element, comprising:
   a substrate made of silicon carbide;
   a drift layer made of silicon carbide, having a first conductivity type, and located on a first surface of the substrate, wherein the substrate and the drift layer has a cell portion;
   an impurity layer having a second conductivity type, located in the cell portion, and located in a surface portion of the drift layer;
   a first electrode located on a first surface side of the substrate so that the impurity layer and the drift layer are located between the first electrode and the substrate;
   a second electrode located on a second surface side of the substrate; and
   a first conductivity type region located in the cell portion, located in the drift layer, spaced away from the impurity layer, located closer to the substrate than the impurity layer, and having an impurity concentration larger than the drift layer,
   wherein the vertical type semiconductor device element is configured so that a current flows between the first electrode and the second electrode.

2. The silicon carbide semiconductor device according to claim 1, wherein
the first conductivity type region includes a plurality of first conductivity type region parts arranged in a direction substantially parallel to the first surface of the substrate.

3. The silicon carbide semiconductor device according to claim 1, wherein
the first conductivity type region is in contact with the substrate.

4. A silicon carbide semiconductor device having an accumulation type MOS structure semiconductor element, comprising:
a substrate made of silicon carbide, and having one of a first conductivity type and a second conductivity type;
a drift layer made of silicon carbide, having the first conductivity type, and located above the substrate, wherein the substrate and the drift layer provide a cell portion;
a base region made of silicon carbide, having the second conductivity type, located in the cell portion, and located in a surface portion of the drift layer;
a channel region made of silicon carbide, having the first conductivity type, and located on a surface of the base region and a surface of the drift layer;
a source region made of silicon carbide, having the first conductivity type, extending from the channel region into the base region, and having an impurity concentration larger than the drift layer;
a gate insulation film located on a surface of the channel region;
a gate electrode located above the gate insulation film;
a source electrode electrically connected with the source region;
a drain electrode located on a rear surface side of the substrate; and
a first conductivity type region located in the cell portion, located in drift layer, spaced away from the base region, located closer to the substrate than the base region, and having an impurity concentration larger than the drift layer,
wherein the accumulation type semiconductor element is configured so that a current flow between the source electrode and the drain electrode through the source region and the drift layer under control of channel formation in the channel region, the channel formation being controlled by controlling a voltage applied to the gate electrode.

5. The silicon carbide semiconductor device according to claim 4, further comprising:
a trench located in the drift layer, wherein:
the gate electrode is located in the trench through the gate insulation film; and
that the source region and the channel region contact a side wall of the trench, so that the current flows through a portion of the channel region.

6. A silicon carbide semiconductor device having an inversion type MOS structure semiconductor element, the device comprising:
a substrate made of silicon carbide, and having one of a first conductivity type and a second conductivity type;
a drift layer made of silicon carbide, having the first conductivity type, and located above the substrate, wherein the substrate and the drift layer provide a cell portion;
a base region made of silicon carbide, having the second conductivity type, located in the cell portion, and located in a surface portion of the drift layer;
a source region made of silicon carbide, having the first conductivity type, located in the base region, and having an impurity concentration larger than the drift layer;
a gate insulation film located on a surface of the base region;
a gate electrode located above the gate insulation film;
a source electrode electrically connected with the source region;
a drain electrode located on a rear surface side of the substrate; and
a first conductivity type region located in the cell portion, located in drift layer, spaced away from the base region, located closer to the substrate than the base region, having an impurity concentration larger than the drift layer,
wherein the inversion type semiconductor element is configured so that a current flow between the source electrode and the drain electrode through the source region and the drift layer under control of a channel formed in a portion of the base region, the portion contacting the gate electrode, the channel being controlled by a voltage applied to the gate electrode.

7. The silicon carbide semiconductor device according to claim 6, further comprising:
a trench located in the drift layer, wherein:
the gate electrode is located in the trench through the gate insulation film; and
the source region and the base region contact a side wall of the trench, so that the current flows through a portion of the base region contacting the side wall of the trench.

8. The silicon carbide semiconductor device according to claim 6, further comprising:
a contact region for electrically connecting the source electrode and the base region, wherein:
the contact region is located opposite to the channel region with respect to the source region; and
the first conductivity type region is located below the contact region and space away from the base region.

9. The silicon carbide semiconductor device according to claim 6, wherein
the first conductivity type region is located below the source region and spaced away from the base region.

10. The silicon carbide semiconductor device according to claim 6, wherein
the first conductivity type region is located below the trench and spaced away from the trench.

11. The silicon carbide semiconductor device according to claim 6, wherein:
the first conductivity type region includes a plurality of first conductivity type region parts arranged in a direction parallel to a top surface of the substrate.

12. The silicon carbide semiconductor device according to claim 6, wherein:
the first conductivity type region contacts the substrate.

13. A silicon carbide semiconductor device comprising:
a substrate made of silicon carbide, having a first conductivity type, and having a principal surface and a rear surface;
a drift layer made of silicon carbide, having the first conductivity type, located above the principal surface of the substrate, and having an impurity concentration smaller than the substrate, wherein the substrate and the drift layer provide a cell portion; and
a Schottky barrier diode located in the cell portion, wherein the Schottky barrier diode includes:
a Schottky electrode having a Schottky contact with the drift layer;

an ohmic electrode located on the rear surface of the substrate; and a first conductivity type region located in the drift layer, spaced away from the Schottky electrode, and having an impurity concentration larger than the drift layer.

14. The silicon carbide semiconductor device according to claim 13, further comprising:

a termination structure located in a periphery of the cell portion, wherein:

the termination structure includes a second conductivity type region;

the second conductivity type region is located in a surface portion of the drift layer so as to surround the cell portion; and the first conductivity type region is located deeper than the second conductivity type region.

15. The silicon carbide semiconductor device according to claim 13, further comprising:

a junction barrier diode including a plurality of second conductivity type layers, wherein:

each second conductivity type layer is located below a part of the Schottky electrode, the part being in contact with the drift layer;

each second conductivity type layer is in contact with the Schottky electrode at a surface of the drift layer;

the plurality of second conductivity type layers are spaced away from each other; and the first conductivity type region is located in the drift layer, located deeper than the plurality of second conductivity type layers, and spaced away from the plurality of second conductivity type layers.

16. A silicon carbide semiconductor device comprising:

a substrate made of silicon carbide, having a first conductivity type, and having a principal surface and a rear surface;

a drift layer made of silicon carbide, having the first conductivity type, located on the principal surface of the substrate, and having an impurity concentration smaller than the substrate, wherein the substrate and the drift layer provide a cell portion;

an insulation film located above the drift layer and having an opening located in the cell portion;

a second conductivity type layer located in the cell portion, and located in a surface portion of the drift layer; and a P-N diode located in the cell portion and including:

a first ohmic electrode contacting the second conductivity type layer with an ohmic contact through the opening of the insulation film;

a second ohmic electrode located on a rear surface of the substrate; and a first conductivity type region located in the cell portion, located in the drift layer, located deeper than the second conductivity type layer, having an impurity concentration larger than the drift layer.

17. The silicon carbide semiconductor device according to claim 16, further comprising:

a termination structure located in a periphery of the cell portion and including a second conductivity type region, wherein:

the second conductivity type region is located in a surface portion of the drift layer so as to surround the cell portion; and the first conductivity type region is located deeper than the second conductivity type region.

18. The silicon carbide semiconductor device according to claim 16, wherein the impurity concentration of the first conductivity type region is greater than or equal to $1 \times 10^{17}$ cm$^{-3}$.

* * * * *